United States Patent
Jeong

(10) Patent No.: US 8,975,906 B2
(45) Date of Patent: Mar. 10, 2015

(54) PROBE FOR INSPECTING ELECTRONIC COMPONENT

(75) Inventor: Woo-Yoel Jeong, Cheonan-si (KR)

(73) Assignee: NTS Co., Ltd., Cheonan Si, Chungcheongnam-Do (KR)

( * ) Notice: Subject to any disclaimer, the term of this patent is extended or adjusted under 35 U.S.C. 154(b) by 204 days.

(21) Appl. No.: 13/700,859

(22) PCT Filed: Jul. 6, 2010

(86) PCT No.: PCT/KR2010/004396
§ 371 (c)(1),
(2), (4) Date: Nov. 29, 2012

(87) PCT Pub. No.: WO2011/152588
PCT Pub. Date: Dec. 8, 2011

(65) Prior Publication Data
US 2013/0069684 A1      Mar. 21, 2013

(30) Foreign Application Priority Data

Jun. 1, 2010 (KR) .................. 10-2010-0052020

(51) Int. Cl.
*G01R 31/20* (2006.01)
*G01R 1/067* (2006.01)

(52) U.S. Cl.
CPC .................................. *G01R 1/06722* (2013.01)
USPC ............ 324/754.03; 324/754.01; 324/755.01; 324/755.11; 324/755.05

(58) Field of Classification Search
CPC ............... G01R 1/067; G01R 1/06722; G01R 1/06755; G01R 31/02; G01R 31/26; H05K 7/1069; H01R 13/2421; H01R 12/7082; H01R 12/714; H01R 2201/20
USPC ............. 324/755.05, 750.25, 750.27, 754.05, 324/754.07, 754.11, 754.14, 755.07, 324/754.01, 754.03, 755.01, 755.11; 439/66
See application file for complete search history.

(56) References Cited

U.S. PATENT DOCUMENTS

| 2005/0030050 | A1 | 2/2005 | Jung |
| 2006/0073710 | A1* | 4/2006 | Hwang ........................ 439/66 |
| 2009/0075529 | A1* | 3/2009 | Johnston et al. ............. 439/824 |

FOREIGN PATENT DOCUMENTS

| CN | 1808127 A | 7/2006 |
| CN | 2795864 Y | 7/2006 |

(Continued)

OTHER PUBLICATIONS

International Search Report mailed Jul. 27, 2011 for PCT/KR2010/004396.

(Continued)

*Primary Examiner* — Tung X Nguyen
*Assistant Examiner* — Son Le
(74) *Attorney, Agent, or Firm* — Lowe Hauptman & Ham, LLP

(57) ABSTRACT

A probe for inspecting electronic components, and more particularly, to a probe for inspecting electronic components, which connects a target electronic component to an inspection apparatus to inspect defects of the target electronic component. The probe for inspecting electronic components includes: a cylinder body having a cylindrical shape; a piston body reciprocating between an inside and an outside of the cylinder body; a spring surrounding an outer circumference of the cylinder body and the piston body, and forcing a part of the piston body to resiliently move out of the cylinder body when inserted into the cylinder body; a probing unit extending from the cylinder body to be brought into contact with a target electronic component to be inspected as to flow of electric current therethrough; and a contact unit extending from the piston body to be connected to an inspection apparatus for inspecting the target electronic component.

9 Claims, 4 Drawing Sheets

(56) References Cited

FOREIGN PATENT DOCUMENTS

| | | |
|---|---|---|
| CN | 2807263 Y | 8/2006 |
| CN | 201181303 Y | 1/2009 |
| JP | 2000-125324 | 4/2000 |
| JP | 2002-350463 | 12/2002 |
| KR | 20-1998-0054957 | 10/1998 |
| KR | 10-0546361 | 1/2006 |
| KR | 10-0809578 | 3/2008 |
| KR | 20090093738 A * | 9/2009 |
| TW | 200618405 | 6/2006 |
| TW | 200809208 | 2/2008 |
| TW | 200924315 | 6/2009 |
| WO | 2009039205 | 3/2009 |

OTHER PUBLICATIONS

Written Opinion of ISA mailed Jul. 27, 2011 for PCT/KR2010/004396.

* cited by examiner

PROBE FOR INSPECTING ELECTRONIC COMPONENT

CROSS REFERENCE TO RELATED APPLICATION

This application claims the priority of Korean Patent Application No. 10-2010-0052020, filed on Jun. 1, 2010 in the KIPO (Korean Intellectual Property Office). Further, this application is the National Phase application of International Application No. PCT/KR2010/004396 filed Jul. 6, 2010, which designates the United States and was published in Korean.

TECHNICAL FIELD

The present invention relates to a probe for inspecting electronic components, and more particularly, to a probe for inspecting electronic components, which connects a target electronic component with an inspection apparatus in order to inspect defects of the target electronic component.

BACKGROUND ART

An electronic component is a basic electronic element. In general, the electronic component is packaged with two or more leads or is connected to a metal pad.

The electronic component is soldered to a printed circuit board (PCB) so as to provide a certain function as an amplifier, a receiver, an oscillator, and the like.

The electronic component may be packaged as a single device like a resistor, a capacitor, a transistor and a diode, or be configured as an integrated circuit like an operational amplifier, an array resistor and a logic circuit.

In addition, a micro-chip is a chip which includes electronic circuits integrated in high density on a printed circuit board.

Electronic components such as micro-chips, camera modules or the like must undergo inspection using an inspection apparatus in order to confirm whether they are in a normal state before assembly.

As an inspection method, there is a method of performing inspection by mounting an electronic component on an inspection socket, which is provided with inspection probes to inspect the electronic component without damage of the electronic component.

The inspection socket is provided with a plurality of inspection probes such that, when the inspection socket is connected to a target electronic component to be inspected, electric current flows to the inspection apparatus from the inspection probes connected to various points of the electronic component, thereby enabling inspection of the target electronic component.

Conventionally, when a part of the inspection probe connected to the target electronic component is coupled to a different component, a coupling surface between the part of the inspection probe connected to the target electronic component and the different component is smooth and the different component is coupled to the part connected to the target electronic component by compression in an upward or downward direction, so that they are likely to be disconnected or easily separated from each other, thereby causing inconvenience in use of the inspection probe.

In particular, the inspection probe is connected to the target electronic component to cause electric current to flow to the inspection apparatus, thereby enabling inspection on a failure of the target electronic component based on the electric current. At this time, if there is weak connection or disconnection between elements of the inspection probe, it is impossible to accurately inspect the electronic component due to an abnormal electric conduction therebetween.

Further, the inspection probe needs good electric conductivity to inspect the electronic component and is thus generally plated with a conductive material. However, it is difficult to plate the probe when various elements are assembled into the inspection probe.

DISCLOSURE

Technical Problem

The present invention is conceived to solve the problems in the art, and an aspect of the present invention is to provide a probe for inspecting electronic components, which allows a different component to be firmly coupled to a part of the probe connected to a target electronic component when the different component is coupled to the part of the probe in an upward or downward direction.

Another aspect of the present invention is to provide a probe for inspecting electronic components, which has improved electric conductivity even though various elements are assembled into the probe that makes electric current flow from a target electronic component to an inspection apparatus which inspects the target electronic component.

A further aspect of the present invention is to provide a probe for inspecting electronic components, which allows easy plating in order to improve electric conductivity of the probe that allows electric current to flow between a target electronic component and an inspection apparatus therethrough.

Technical Solution

In accordance with one aspect of the present invention, a probe for inspecting electronic components includes: a cylinder body having a cylindrical shape; a piston body reciprocating between an inside and an outside of the cylinder body; a spring surrounding an outer circumference of the cylinder body and the piston body, and forcing a part of the piston body to resiliently move out of the cylinder body when inserted into the cylinder body; a probing unit extending from the cylinder body to be brought into contact with a target electronic component to be inspected as to conduction of electric current therethrough; and a contact unit extending from the piston body to be connected to an inspection apparatus for inspecting the target electronic component.

The probing unit may include a probing pin brought into close contact with the target electronic component; and a probing body surrounding and holding the probing pin.

The probing pin may include an accommodating groove formed along an outer circumference thereof in a horizontal direction, and a securing projection formed along an inner circumference thereof in the horizontal direction to be accommodated in the accommodating groove.

The securing projection may include four securing projections protruding toward the accommodating groove in four horizontal directions.

The spring may include first and second double lines each being doubly formed at distal and fore ends thereof connected to the cylinder body and the piston body, respectively.

The spring may have a plated outer surface.

The cylinder body may include a support sill supporting the spring.

The piston body may further include a separation-preventing sill preventing the spring from being separated from the cylinder body and the piston body.

The spring may be interposed between the probing unit and the contact unit while surrounding the cylinder body and the piston body to allow efficient flow of electric current between the probing unit and the contact unit.

The probing unit may include a hemispherical and convex portion to be brought into contact with the target electronic component.

The contact unit may include a plurality of contact pieces each having a quadrangular pyramid-shaped portion to be brought into contact with the inspection apparatus.

Advantageous Effects

The probe for inspecting electronic components according to the present invention allows a different component to be firmly coupled to a part of the probe connected to a target electronic component such that the target electronic component can be accurately inspected, thereby improving inspection reliability.

In addition, the probe according to the present invention may achieve accurate inspection with respect to a target electronic component by improving electric conductivity even in the case where the probe is constituted by various elements.

Further, the probe according to the present invention may allow easy plating to improve electrical conductivity, thereby enabling efficient plating while improving electric conductivity.

BEST MODE

Figure 1:
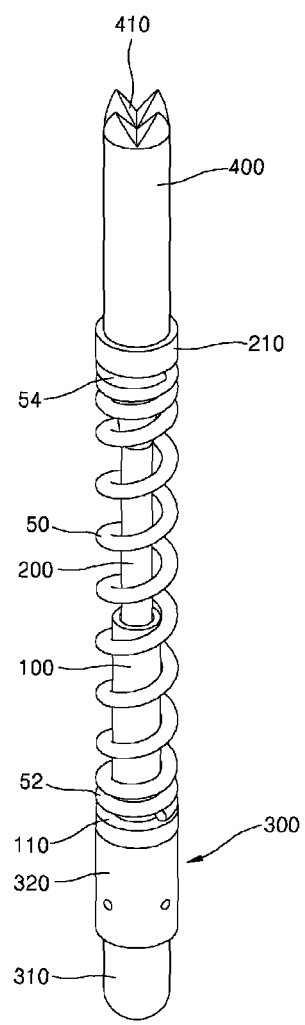
FIG. 1 is a perspective view of a probe for inspecting electronic components according to one embodiment of the present invention.

Hereinafter, the present invention will be described with reference to exemplary embodiments in conjunction with the accompanying drawings. These embodiments will be described such that the present invention can be easily realized by a person having ordinary knowledge in the art. Here, although various embodiments are disclosed herein, it should be understood that these embodiments are not intended to be exclusive. For example, individual structures, elements or features of a particular embodiment are not limited to that particular embodiment, but can be applied to other embodiments without departing from the spirit and scope of the present invention. In addition, it should be understood that locations or arrangement of individual components in each of the embodiments may be changed without departing from the spirit and scope of the present invention. Therefore, the following embodiments are not to be construed as limiting the invention, and the present invention should be limited only by the claims and equivalents thereof. Like components will be denoted by like reference numerals, and lengths, areas, thicknesses and shapes of the components are not drawn to scale throughout the accompanying drawings.

Below, exemplary embodiments of the present invention will be described in detail with reference to the accompanying drawings so as to be easily realized by a person having ordinary knowledge in the art.

Now, a probe for inspecting electronic components according to one embodiment of the invention will be described. The probe 10 includes a cylinder body 100 having a cylindrical shape, a piston body 200 reciprocating between an inside and an outside of the cylinder body 100 through elasticity of a spring 50, a probing unit 300 extending from the cylinder body 100 and connected to a target electronic component 10 to be inspected as to conduction of electric current therethrough, and a contact unit 400 extending from the piston body 200 and connected to an inspection apparatus 30 for inspecting the electronic component 10, but the present invention is not limited thereto. Such features (particularly, the cylinder body 100, the piston body 200 and the spring 50) of the probe may be applied to all technical fields of defect inspection of electronic components.

The electronic component may be provided with a microchip having a plurality of electronic circuits integrated in high density on a circuit board.

The inspection probe is used to inspect whether electric current smoothly flows through the electronic component to allow the electronic component to function properly.

Further, the probe includes the probing unit 300 to be connected to the target electronic component 10 to be inspected as to the conduction of electric current, and the contact unit 400 to be brought into contact with the inspection apparatus 30 for inspecting the electronic component 10, in which the probing unit 300 and the contact unit 400 are connected such that electric current can flow therebetween.

FIG. 1 is a perspective view of a probe for inspecting electronic components according to one embodiment of the present invention.

Referring to FIG. 1, the probing unit 300 is configured to be connected to the electronic component 10, and the cylinder body 100 extends from the probing unit 300 and has a cylindrical shape.

Then, the piston body 200 is configured to reciprocate between the inside and the outside of the cylinder body 100, and the contact unit 400 extends from the piston body 200 to contact the inspection apparatus 30 for inspecting the electronic component 10 as to conduction of electric current.

Further, the spring 50 is placed on outer circumferences of the cylinder body 100 and the piston body 200 such that the piston body 200 is forced to move out of the cylinder body 100 by elasticity of the spring 50 when partially inserted into the cylinder body 100.

In addition, the electronic component 10 is subjected to inspection to confirm smooth flow of electric current. If the electronic component 10 does not pass a predetermined standard since it does not allow electric current to flow properly therethrough or does not function properly, the electronic component 10 will be determined as a defective component.

To inspect whether the electronic component 10 has a defect, the inspection apparatus 30 is used.

To this end, the electronic component 10 is contacted to the probing unit 300, and the probing unit 300 is integrally formed with the cylinder body 100.

Further, the piston body 200 reciprocates between the inside and the outside of the cylinder body 100 while being partially inserted into the cylinder body 100. Reciprocation of the piston body 200 is allowed by elasticity of the spring 50.

The contact unit 400 extending from the piston body 200 is preferably brought into contact with the inspection apparatus 30 that will inspect the electronic component 10.

Further, the part of the piston body 200 inserted into the cylinder body 100 is always connected to the cylinder body 100 instead of completely escaping the cylinder body 100.

This is because electric current flows from the probing unit 300 to the inspection apparatus 30 through the piston body 200 and the contact unit 400 via the cylinder body 100 when the inspection apparatus 30 allows the electric current to flow to the electronic component 10 in order to inspect the flow of electric current in the electronic component 10.

In particular, the probing unit 300, the cylinder body 100, the piston body 200, the contact unit 400 and the spring 50 may be plated to allow smooth flow of electric current.

Figure 2:
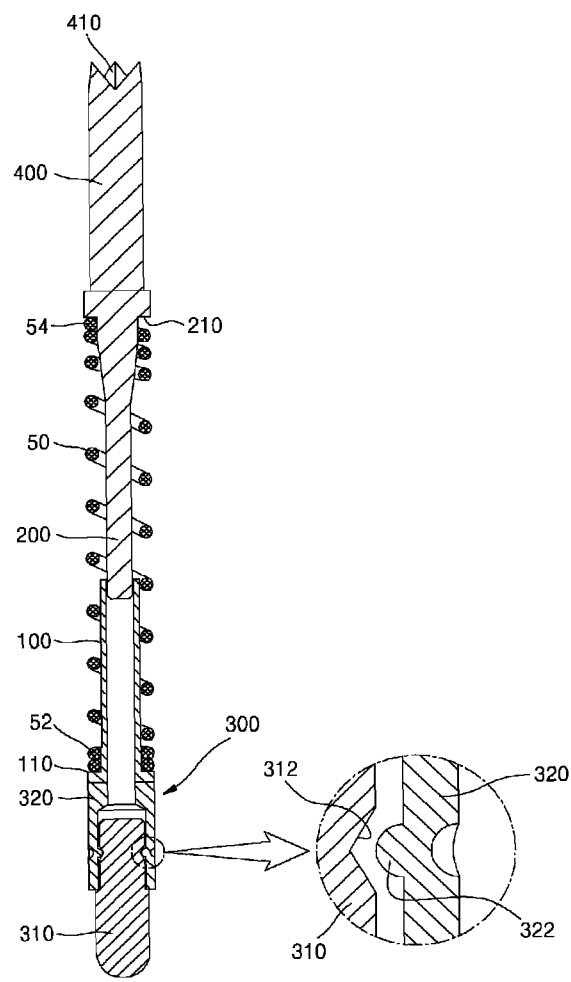
FIG. 2 is a cross-sectional view of the probe for inspecting electronic components according to the embodiment of the present invention.

FIG. 2 is a cross-sectional view of the probe for inspecting electronic components according to the embodiment of the present invention.

Referring to FIG. 2, the probing unit 300 contacted to the electronic component 10 to be inspected as to flow of electric current includes a probing pin 310 to closely contact the electronic component 10, and a probing body 30 surrounding and holding the probing pin 310.

Further, the probing pin 310 includes an accommodating groove 312 formed along an outer circumference thereof in a horizontal direction, and a securing projection 322 formed along an inner circumference thereof in the horizontal direction to be accommodated in the accommodating groove 312.

As a result, the securing projection 322 is coupled to the accommodating groove 312, so that the probing pin 310 can be firmly fastened and coupled to the probing body 320.

At this time, the securing projection 322 includes four securing projections 322 horizontally protruding toward the accommodating groove 312 in four directions.

Here, since the accommodating groove 312 of the probing pin 310 is located at a predetermined position on the inner circumference of the probing body 320 and then the securing projections 322 are formed by applying pressure to four points on the outer circumference of the probing body 320 from the outside, the securing projections 322 are coupled to four points of the accommodating groove 312.

Thus, the securing projections 322 formed by pressing four points on the outer surface of the probing body 320 outside the probing body 320 are firmly fastened to the accommodating groove 312 of the probing pin 310.

This makes it convenient to firmly couple the probing pin 310 to the probing body 320.

Further, the probing pin 310 has a hemispherical and convex portion to be brought into contact with the electronic component 10.

As the part of the probing pin 310 to be brought into closely contact with the electronic component 10 is hemispherical and convex, it is possible to prevent the electronic component 10 from being damaged thereby.

In addition, the probing body 320 has an upper portion integrally connected to the cylinder body 200.

The cylinder body 100 is connected to the piston body 200.

Further, the spring 50 surrounding the outer circumferences of the cylinder body 100 and the piston body 200 is supported by a support sill 110 formed at the upper portion of the cylinder body 100.

The piston body 200 includes a separation-preventing sill 210 to prevent the spring 50 from being separated from the cylinder body 100 and the piston body 200.

As a result, a lower portion of the spring 50 is in close contact with and supported by the support sill 110 formed at the upper portion of the cylinder body 100, and an upper portion of the spring 50 is in close contact with the separation-preventing sill 210.

Particularly, the spring 50 includes a first double-line 52 doubly formed at the lower portion supported by the support sill 110, and a second double-line 54 doubly formed at the upper portion closely contacting the separation-preventing sill 210.

The spring 50 including the first and second double lines 52, 54 is in close-contact with the support sill 110 and the separation-preventing sill 210, whereby electric current can efficiently flow from the probing unit 300 to the contact unit 400.

The contact unit 400 is integrally formed with the piston body 200, and includes a plurality of contact pieces 410, each of which has a quadrangular pyramid-shaped portion to be brought into contact with the inspection apparatus 30.

The quadrangular pyramid shape of the contact piece 410 prevents foreign matter attached to the contact piece 410 from resisting the flow of electric current from the piston body 200 to the inspection apparatus 30.

Figure 3:
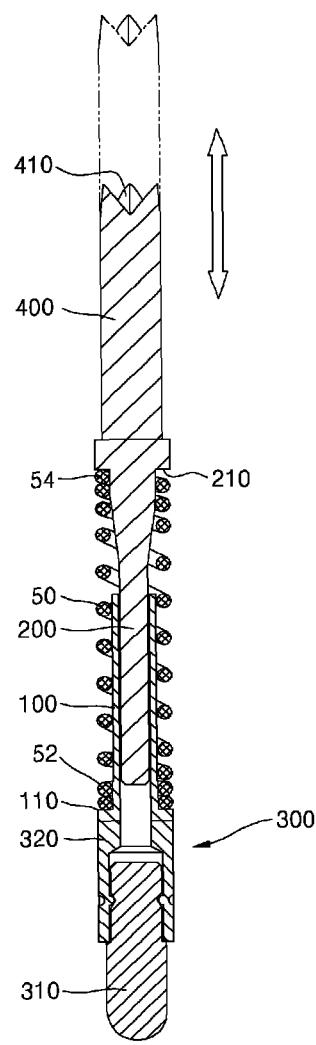
FIG. 3 is a cross-sectional view of the probe for inspecting electronic components according to the embodiment of the present invention.

FIG. 3 is a cross-sectional view of the probe for inspecting electronic components according to the embodiment of the present invention.

Referring to FIG. 3, the spring 50 is interposed between the probing unit 300 and the contact unit 400 while surrounding the cylinder body 100 and the piston body 200, and allows electric current to smoothly flow between the probing unit 300 and the contact unit 400.

In addition, with the probing unit 300 connected to the electronic component 10, the contact unit 400 can be smoothly brought into close contact with the inspection apparatus 30 as follows. With the probing unit 300 connected to the electronic component 10, the piston body 200 is moved downwards and the inspection apparatus 30 is then placed on the upper portion of the contact unit 400 to allow the piston body 200 to be moved upwards by elasticity of the spring 50, whereby the contact unit 400 is in close contact with the inspection apparatus 30.

As a result, the probing unit 300 closely contacts the electronic component 10 to which electric current is flowed, such that the electric current can flow to the piston body 200 via the cylinder body 100 connected to the probing unit 300 and can flow to the inspection apparatus 30 via the contact unit 400 connected to the piston body 200, thereby inspecting whether the electronic component 10 has a defect and completing various inspection tasks.

Here, the positions of the cylinder body 100 and the piston body 200 may be changed as long as they can move up or down in a vertical direction.

In addition, the spring 50 may surround the cylinder body 100 and the piston body 200 so as to compress and closely contact the outer surfaces of the cylinder body 100 and the piston body 200.

This configuration increases electrical conductivity by allowing electric current to flow through the spring 50 while flowing from the probing unit 300 to the cylinder body 100 and the piston body 200.

Figure 4:
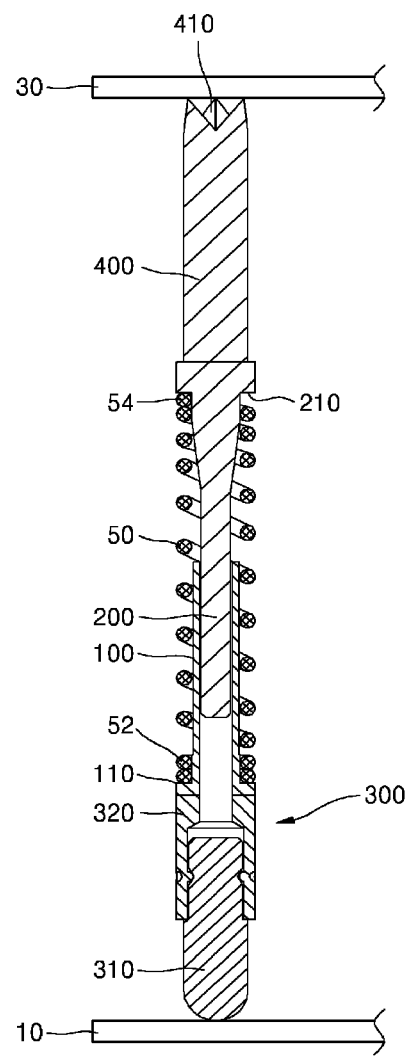
FIG. 4 is a cross-sectional view of the probe for inspecting electronic components in use, according to the embodiment of the present invention.

FIG. 4 is a cross-sectional view of the probe for inspecting electronic components in use according to the embodiment of the present invention.

Referring to FIG. 4, a part of the probing pin 310 closely contacting the electronic component 10 is received in the probing body 320, whereby the securing projection 322 of the probing body 320 can be firmly secured to the accommodating groove 312 of the probing pin 310.

The cylinder body 100 extends from an upper portion of the probing unit 300 that includes the probing pin 310 and the probing body 320.

Further, the cylinder body 100 is provided at the lower portion thereof with the support sill 110 which supports the spring 50.

The piston body 200 is placed inside the cylinder body 100 to reciprocate between the inside and the outside of the cylinder body 100 in the vertical direction.

Further, the piston body 200 is provided at an upper portion thereof with the separation-preventing sill 210 to prevent the spring 50 from being separated from the cylinder body 100 and the piston body 200.

The contact unit 400 is formed on the separation-preventing sill 210 of the piston body 200, and the contact pieces 410 each having a quadrangular pyramid shaped portion are placed on the top of the contact unit 400 to be brought into close contact with the inspection apparatus 30.

At this time, when electric current is supplied to the electronic component 10, the electric current flows to the inspection apparatus 30 while passing through the probing unit 300, the cylinder body 100, the piston body 200 and the contact unit 400, thereby enabling easy confirmation of the state of the electronic component 10.

Here, the electric current can flow through the spring 50, which is placed to surrounding the cylinder body 100 and the piston body 200 to closely contact and compress the outer surfaces of the cylinder body 100 and the piston body 200, so that the spring 50 allows the electric current to flow from the probing unit 300 to the contact unit 400 therethrough.

The spring 50 may be plated to allow smooth flow of electric current.

In particular, the first double line 52 doubly formed at the lower portion of the spring 50 and the second double line 54 doubly formed at the upper portion of the spring 50 allow electric current to flow through the spring 50 from the probing unit 300 and the cylinder body 100 to the piston body 200 and the contact unit 400.

Further, not only the spring 50 but also the probing unit 300, the cylinder body 100, the piston body 200 and the contact unit 400 are all exposed to the outside, thereby facilitating plating for smooth flow of electric current.

Although some embodiments have been described with reference to the accompanying drawings, it should be understood that these embodiments are provided for illustration only and do not limit the scope of the present invention. Further, it will be appreciated by those skilled in the art that various modifications, changes, alterations, and equivalent embodiments can be made without departing from the spirit and scope of the invention.

Therefore, it should be appreciated that the foregoing embodiments are not to be in any way construed as limiting the present invention, and that the scope and sprit of the present invention should be defined only by the accompanying claims and equivalents thereof.

INDUSTRIAL APPLICABILITY

According to the present invention, the probe for inspecting electronic components ensures firm connection between a target electronic component and a part used for inspection, thereby improving inspection reliability when checking whether the electronic component is defective and performs functions properly.

Further, all elements related to electrical conductivity are exposed to the outside in order to improve efficiency in plating operation for plating the probe to enhance electric conductivity thereof.

Thus, it is possible to achieve desirable plating operation in a short period of time when plating the probe.

The invention claimed is:

1. A probe for inspecting electronic components, the probe comprising:
    a cylinder body having a cylindrical shape;
    a piston body configured to reciprocate between an inside and an outside of the cylinder body;
    a spring surrounding an outer circumference of the cylinder body and the piston body, and configured to force a part of the piston body to resiliently move out of the cylinder body when the part of the piston body is inserted into the cylinder body;
    a probing unit extending from the cylinder body, and configured to contact with a target electronic component to be inspected;
    a contact unit extending from the piston body, and configured to contact with an inspection apparatus which is configured to inspect conduction of electric current of the target electronic component; and
    a probing body surrounding and holding a probing pin,
    wherein the probing pin has a unibody structure which includes
    a hemispherical end portion configured to directly contact with the target electronic component, and
    an accommodating groove disposed along an outer circumference of the probing pin in a horizontal direction, and
    wherein the probing body comprises:
    a securing projection disposed along an inner circumference of the probing body in the horizontal direction, and configured to be accommodated in the accommodating groove.

2. The probe according to claim 1, wherein the securing projection comprises four securing projections protruding toward the accommodating groove in horizontal four directions.

3. The probe according to claim 1, wherein the spring comprises first and second double lines each being doubly disposed at distal and fore ends thereof connected to the cylinder body and the piston body, respectively.

4. The probe according to claim 1, wherein the spring has a plated outer surface.

5. The probe according to claim 1, wherein the cylinder body comprises a support sill configured to support the spring.

6. The probe according to claim 1, wherein the piston body further comprises a separation-preventing sill configured to prevent the spring from being separated from the cylinder body and the piston body.

7. The probe according to claim 1, wherein the spring is interposed between the probing unit and the contact unit while surrounding the cylinder body and the piston body to allow flow of electric current between the probing unit and the contact unit.

8. The probe according to claim 1, wherein the hemispherical end portion is convex toward the target electronic component to be inspected.

9. The probe according to claim 1, wherein the contact unit comprises a plurality of contact pieces having a quadrangular pyramid-shaped portion configured to contact with the inspection apparatus.

* * * * *